US005564932A

United States Patent [19]
Castleman

[11] Patent Number: 5,564,932
[45] Date of Patent: Oct. 15, 1996

[54] CUSTOMIZEABLE INTERCONNECT DEVICE FOR STACKING ELECTRICAL COMPONENTS OF VARYING CONFIGURATION

[76] Inventor: Mark-Andrew B. Castleman, 6000 Shepherd Mountain Cove, #221, Austin, Tex. 78730

[21] Appl. No.: 339,903

[22] Filed: Nov. 14, 1994

[51] Int. Cl.$^6$ ............................................. H01R 9/09
[52] U.S. Cl. ............................................. 439/70
[58] Field of Search ................................. 439/68–73

[56] References Cited

U.S. PATENT DOCUMENTS

| | | |
|---|---|---|
| 3,573,617 | 4/1971 | Randolph . |
| 3,701,077 | 10/1972 | Kelly, Jr. . |
| 4,516,072 | 5/1985 | Marpoe, Jr. . |
| 4,541,676 | 9/1985 | Hansen et al. . |
| 4,547,028 | 10/1985 | Morgan et al. . |
| 4,637,670 | 1/1987 | Coller et al. ............... 439/331 |
| 4,671,592 | 6/1987 | Ignasiak et al. . |
| 4,688,864 | 8/1987 | Sorel ............................ 439/69 |
| 4,691,975 | 9/1987 | Fukunaga et al. ........... 439/266 |
| 4,696,525 | 9/1987 | Coller et al. ................ 439/69 |
| 4,747,017 | 5/1988 | Koors et al. ................ 439/68 |
| 4,853,626 | 8/1989 | Resler ........................ 439/290 |
| 4,866,374 | 9/1989 | Cedrone ..................... 439/68 |
| 4,996,476 | 2/1991 | Balyasny et al. .......... 439/70 |
| 5,033,977 | 7/1991 | Ignasiak .................... 439/482 |
| 5,152,694 | 10/1992 | Bargain ..................... 439/70 |
| 5,156,649 | 10/1992 | Compton et al. .......... 439/68 |
| 5,180,976 | 1/1993 | Van Loan et al. ........ 439/70 |
| 5,205,741 | 4/1993 | Steen et al. ............... 439/70 |
| 5,208,529 | 5/1993 | Tsurishima et al. ...... 439/70 |
| 5,266,059 | 11/1993 | Taylor ....................... 439/68 |
| 5,307,240 | 4/1994 | McMahon ................. 439/69 |
| 5,364,278 | 11/1994 | Laub ......................... 439/69 |
| 5,429,511 | 7/1995 | DelPrete et al. .......... 439/69 |

FOREIGN PATENT DOCUMENTS 2146792 6/1990 Japan ....................................... 439/69

OTHER PUBLICATIONS

IBM Technical Disclosure Bulletin, vol. 16, No. 4, Sep. 1973.
IBM Technical Disclosure Bulletin, vol. 23, No. 6, Nov. 1980.

*Primary Examiner*—Gary F. Paumen
*Assistant Examiner*—Jill Demello
*Attorney, Agent, or Firm*—Kevin L. Daffer

[57] ABSTRACT

A customizeable interconnect device is provided for coupling a base component to a stacked insert component. The interconnect device is customizeable to provide connection between various types of components, regardless of whether the components are leaded or leadless, or whether the lead pitch is large or small. The interconnect device is fully customized by modifying a retainer, a base and/or a housing. Each part (i.e., base, retainer and housing) is coupled together as a modular assembly, wherein the base is customizable to fit the lead arrangement of the base component, and the retainer is customizable to fit the lead arrangement of a daughter board edge connector. One or more daughter boards are inserted into corresponding housing units in stacked, spaced arrangement over a base component to enhance interconnect density in a three-dimensional fashion.

20 Claims, 6 Drawing Sheets

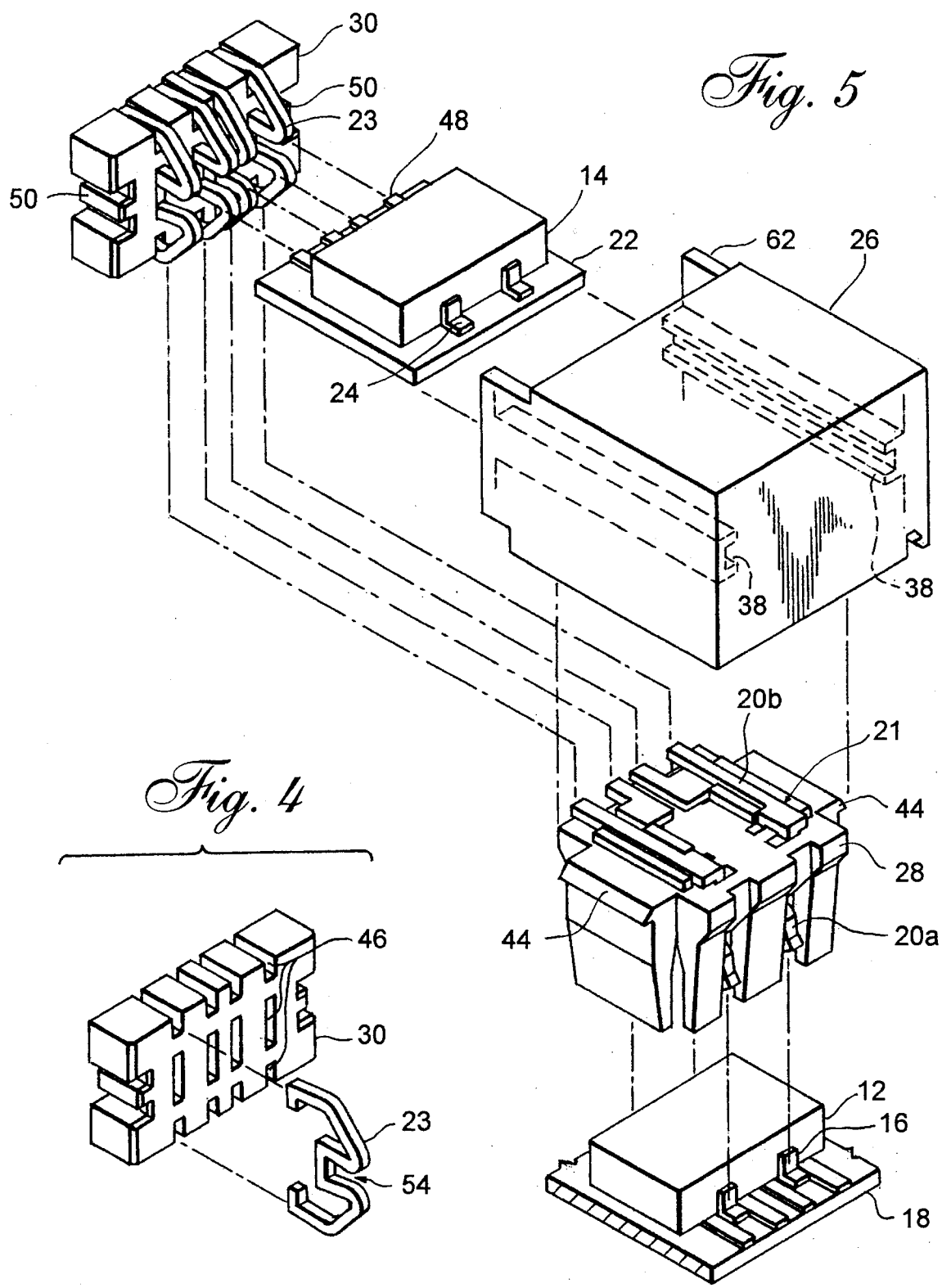

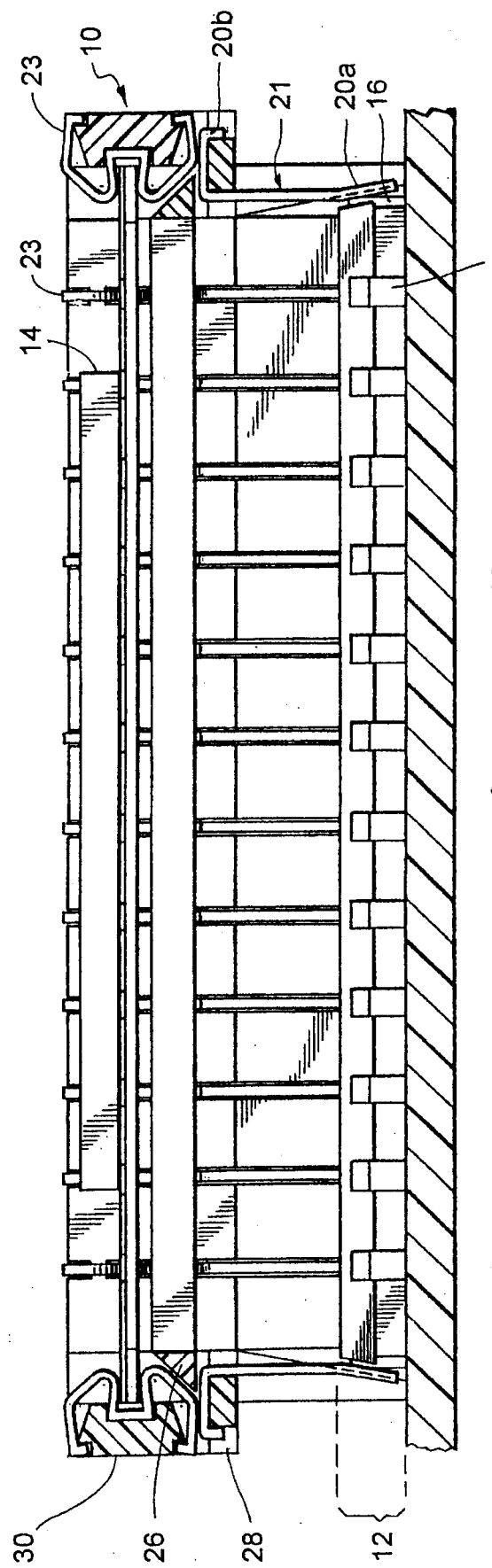
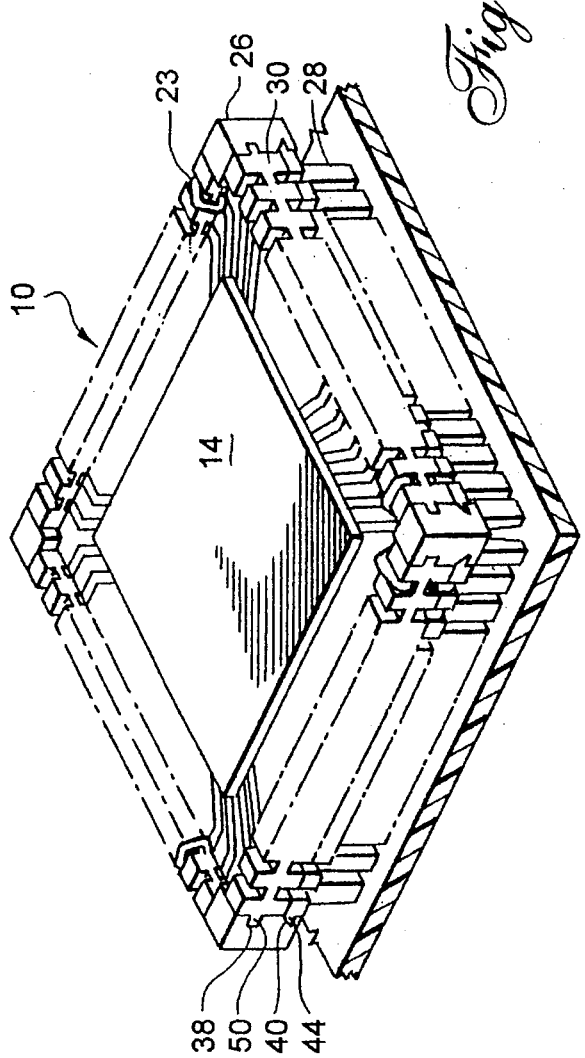
Fig. 8
Fig. 9

CUSTOMIZEABLE INTERCONNECT DEVICE FOR STACKING ELECTRICAL COMPONENTS OF VARYING CONFIGURATION

BACKGROUND OF THE INVENTION

1. Field of the Invention

This invention relates to packaged integrated circuits and more particularly to an interconnected device which can be customized for stackably interconnecting leads of one packaged integrated circuit to leads of another packaged integrated circuit.

2. Description of the Relevant Art

Stacking of packaged integrated circuits (referred to herein as "components") is well known. Placing one component a spaced distance over another component minimizes the amount of circuit board area consumed by the stacked components. Instead of interconnecting leads laterally spaced from each other across a board, leads of stacked components are vertically interconnected. Exemplary stacking applications include memory expansion and microprocessor enhancement (e.g., stacking parallel processor components and/or coupling a high speed clocking component upon a processor component). Depending upon the application, stacking of components has provided add-on capability and has minimized circuit board usage.

There are many types of stacking techniques currently used. Described in U.S. Pat. No. 4,696,525 is a dual-in-line package ("DIP") which can be stacked upon another DIP using an interconnect device coupled therebetween. The interconnect device of U.S. Pat. No. 4,696,525 includes upwardly extending and downwardly extending contact arms which connect with leads on the upper and lower components, respectively. Once stacked, solder is dispensed at the contact points to retain electrical connection.

The solder joint between the upper and lower components of U.S. Pat. No. 4,696,525 proves a burden if rework is necessary in the field. Reworking a solder joint requires heating the joint, which implies access to the joint via a heat source. To avoid the cumbersome nature of such rework, it would be advantageous to use an interconnect device which does not require solder. A desirable interconnect device must therefore be connected together solely by fittings having frictional engagement, and must be connected between a lower component and an upper component with similar frictional engagement. The interconnect device must also be capable of interconnecting components of dissimilar geometries and dissimilar lead configurations. In the latter instance, a more optimal interconnect device must therefore be fully customizeable.

The advantages of a fully customizeable interconnect device are manyfold. The interconnect device must be capable of connecting one or more leads of a lower component to one or more leads of an upper component. As defined herein, a "lead" includes an electrical contact point extending from or arranged upon the component, and thereby encompasses contact points on what is often referred to as "leaded" or "leadless" components. The lower and upper components can therefore be any pair of packaged integrated circuits, including chip carriers, flat packs, small outline packages, pin-grid arrays (PGAs) and/or DIPs. To be fully customizeable, the interconnect device must be capable of interconnecting between any of the aforementioned leads extending from or residing on any of the aforementioned components.

SUMMARY OF THE INVENTION

The problems outlined above are in large part solved by the interconnect device of the present invention. That is, the interconnect device hereof includes an assembly of parts which are fitted together and placeable between lower and upper components absent solder. Select parts are interchangeable to form a customized interconnect scheme. The interconnect device includes three interchangeable parts: a base, a retainer and a housing. The base and retainer each include sockets dimensioned to receive base conductors and retainer conductors, respectively. Except for the quantities used, base conductors and retainer conductors remain constant in configuration and do not change with customization. The base, retainer and/or housing can be interchanged with another base, retainer and/or housing to accommodate changes in the lower and upper component configuration, lead locations and/or pitch distances. Thus, the interconnect device hereof is fully customizeable to accommodate varying types of components, and can be used to interconnect one type of component to another type (i.e., interconnect a DIP to a leadless chip carrier, etc.).

According to one embodiment, a DIP lower component (base component) can be interconnected to a DIP upper component (insert component). According to another embodiment, a leaded chip carrier lower base component can be interconnected to a leaded or leadless chip carrier insert component. According to yet another embodiment, a leadless chip carrier base component can be interconnected to a leaded or leadless chip carrier insert component. Additionally, any of the aforementioned embodiments can be intermixed to provide full customization of any base component type to any insert component type.

In any of the above embodiments, the interconnect device is coupled between leads of the base component arranged upon a mother board and the insert component arranged upon a daughter board. As defined herein, "daughter board" is any board which is stacked a spaced distance above a "mother board". The daughter board and mother board are each printed circuit boards manufactured according to well-known techniques. The daughter board, like the mother board, includes printed conductors. A set of printed conductors upon the daughter board extend from leads of the insert component to edge connectors arranged at least partially across one edge of the daughter board. The interconnect device includes interconnect conductors comprising connected base conductors and retainer conductors. The interconnect conductors extend from the base component leads and edge connectors, wherein the edge connectors are connected to respective leads of the insert component.

Broadly speaking, the present invention contemplates an interconnect device comprising a customizeable assembly of parts adapted for coupling between a base component arranged upon a mother board and an insert component arranged upon a daughter board. The interconnect device includes interconnect conductors extending between leads upon the base component and edge connectors arranged upon an edge of the daughter board.

The present invention further contemplates an interconnect device comprising a plurality of base conductors dimensioned to fit within slots arranged upon the base. Each of the base conductors includes an upper portion and a lower portion arranged orthogonal to the upper portion. The upper portion includes an end which terminates at one side of the base and the lower portion includes an end which terminates as a spring element adapted during use to frictionally engage with a base component lead. A plurality of retainer conductors are dimensioned to securely fit within a row of spaced slots arranged upon the retainer. Each of the retainer conductors includes substantially flat upper and lower portions adjoined by a pair of flexible curved portions and a groove therebetween. A housing is adapted to electrically connect base conductors assembled upon the base to retainer conductors assembled upon the retainer.

The present invention still further contemplates a stacked interconnect device. The stacked interconnect device comprises a first customizeable assembly of parts comprising a plurality of base conductors and a first set of retainer conductors connected together to form a conductive path between downward extending elements formed at terminating ends of the base conductor and laterally extending grooves of the first set of retainer conductors. The stacked interconnect device further includes a second customizeable assembly of parts stacked upon the first customizeable assembly of parts. The second assembly includes a second set of retainer conductors having laterally extending grooves, wherein the second set of retainer conductors extend from the upper exposed surfaces of respective first set of retainer conductors such that the grooves extend a spaced distance above the upper exposed surfaces.

The present invention yet further contemplates a method for interconnecting leads of a base component to leads of one or more insert components stacked a spaced distance above the base component. The method comprises coupling leads of an insert component to printed conductors which extend across the daughter board. The printed conductors extend from the leads of the insert component to edge connectors formed at an edge of the daughter board. A customizeable base is then selected having a dimension necessary to frictionally fit over the base component residing upon a mother board. The base includes a series of slots arranged in registry with leads of the base component. At least one base conductor is then inserted into a slot within the base. A customizeable retainer is then selected having a row of slots arranged in registry with the edge connectors. At least one retainer conductor is then inserted into a slot within the retainer. The base conductor is then coupled to a lead of the base component by frictionally engaging the customizeable base over the base component while retaining the base component within the mother board. The retainer conductor is coupled to the edge connector by slideably engaging the retainer within a customizeable housing adapted to receive the daughter board. The base and retainer conductors are then coupled together by fitting the base into the housing.

It is appreciated from the description which follows that the base can be changed to match any base component and leads thereof. Sockets within the base can be customized according to the chosen base in order for base conductors inserted within the sockets to be placed in registry with the outer surface of base component leads. Further, retainer conductors, the number of retainer conductors, and the spacing between retainer conductors is determined by a customizeable retainer and is dependent upon the chosen base configuration and the insert component lead configuration. Accordingly, the interconnect device hereof can be fully customized to any component and/or lead configuration of the base and insert components by only changing the configuration of the base, retainer and/or housing.

BRIEF DESCRIPTION OF THE DRAWINGS

Other objects and advantages of the invention will become apparent upon reading the following detailed description and upon reference to the accompanying drawings in which:

FIG. 4 is an exploded isometric view of a retainer having a row of slots configured to receive retainer conductors of the present invention;

FIG. 5 is an exploded isometric view of the base and retainer customizeable according to the present invention to fit within the customizeable housing in electrical connection between the insert component and the base component;

FIG. 8 is a cross-sectional view, partly in elevation, of an interconnect device of the present invention assembled according to another embodiment between a leaded chip carrier base component arranged upon the mother board and a leaded or leadless insert component arranged upon the daughter board;

FIG. 9 is an isometric view of the assembled embodiment of FIG. 8;

Figure 1:
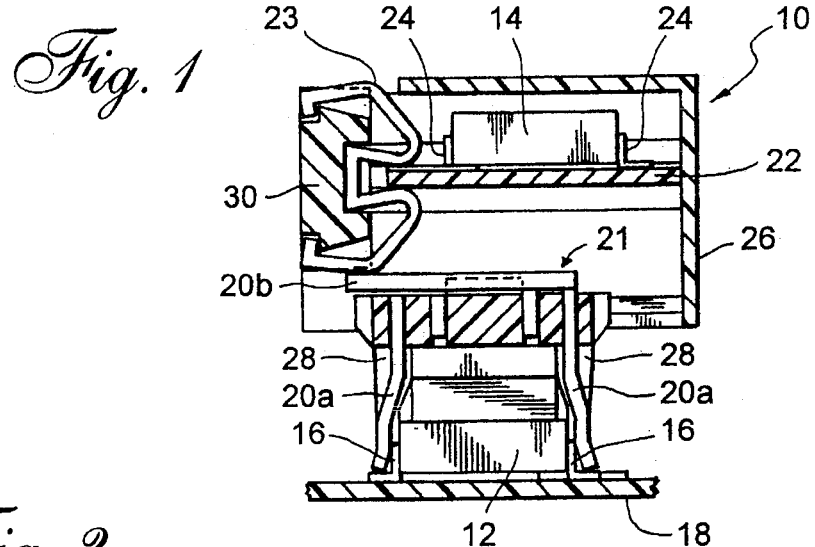
FIG. 1 is a cross-sectional view, partly in elevation, of an interconnect device of the present invention assembled according to one embodiment between a DIP base component arranged upon a mother board and a DIP insert component arranged upon a daughter board.

While the invention is susceptible to various modifications and alternative forms, specific embodiments thereof are shown by way of example in the drawings and will herein be described in detail. It should be understood, however, that the drawings and detailed description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 is a cross-sectional view, partly in elevation, of an interconnect device 10 assembled between a DIP base component 12 and one or more DIP insert components 14. Base component 12 includes a set of leads 16 connected to printed conductors extending upon and/or within mother board 18. Leads 16 are connected to printed conductors using any well-known interconnect technique. A suitable technique includes surface mount, plated through-hole and/or metal eyelet.

Leads 16 extend from opposing sides of DIP base component 12. Each lead 16 has an exposed outer surface upon which a base conductor 21 is connected. Base conductor 21 includes two portions: a downward-extending portion 20a, and a lateral-extending portion 20b. Downward-extending portion 20a is adapted to spring laterally outward as it frictionally engages with the outer surface of leads 16. Each downward-extending portion 20a is thereby dimensioned in registry with the outer surface of respective leads 16 such that interconnect device 10 can be fitted over leads 16 to form an electrical connection therewith. Electrical connection is achieved without dispensing solder and the disadvantages thereof.

Lateral-extending portions 20b are formed orthogonal to downward-extending portions 20a. Portions 20b and 20a are unibody, wherein portions 20a extend from portions 20b and terminate at one side of interconnect device 10. When interconnect device 10 is assembled, lateral-extending portions 20b connect in frictional engagement with retainer conductors 23 to form an overall interconnect conductor configuration. Interconnect conductors thereby comprise base conductors 21 and retainer conductors 23 connected together between base component 12 leads and edge connectors formed on one edge of a daughter board 22, as will be described below. Each retainer conductor 23 is therefore designed to connect between the upper surface of respective lateral-extending portions 20b and the edge connectors. Similar to mother board 18, daughter board 22 includes a plurality of printed conductors arranged upon or within board 22. The printed conductors are connected to leads 24 upon insert component 14. Daughter board 22 is retained within housing 26, and housing 26 provides connecting areas to which base 28 and retainer 30 can couple.

Figure 2:
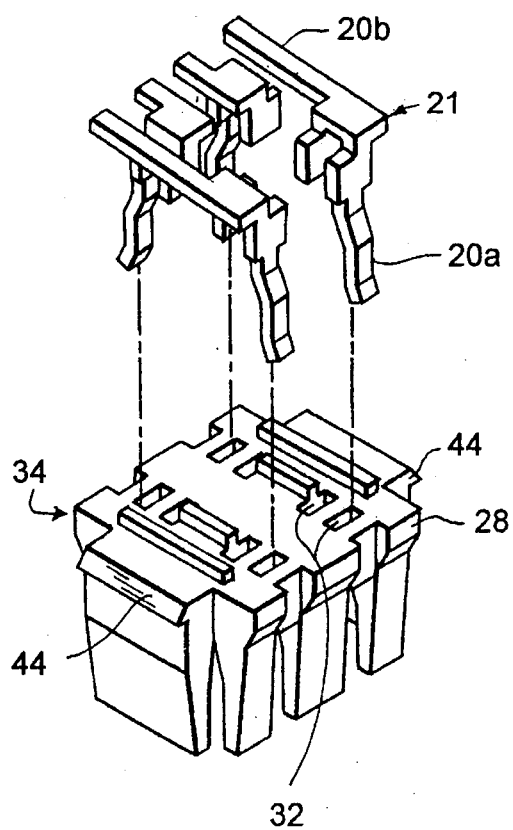
FIG. 2 is an exploded isometric view of a base having slots configured to receive base conductors of the present invention.

Referring to now to FIG. 2, an exploded isometric view of base 28 is shown. Base 28 includes a series of spaced slots 32. According to one example, a pair of slots 32 are used to accommodate downward extending portions 20a of base conductors 21. Base conductors 21 are made of any conductive material such as a metal or metal alloy. Base conductors 21 further include laterally extending upper portions 20b of varying lengths. Lateral-extending portions 20b are used to route connection of leads 16 to one side of base 28. When connecting leads 16 on one side of base component 12 to an opposing side of base 28, lateral-extending portions 20b must be long enough to accommodate that routing. Each lateral upper portion 20b terminates at one end 34 of base 28, at the upper surface of base 28.

Figure 3:
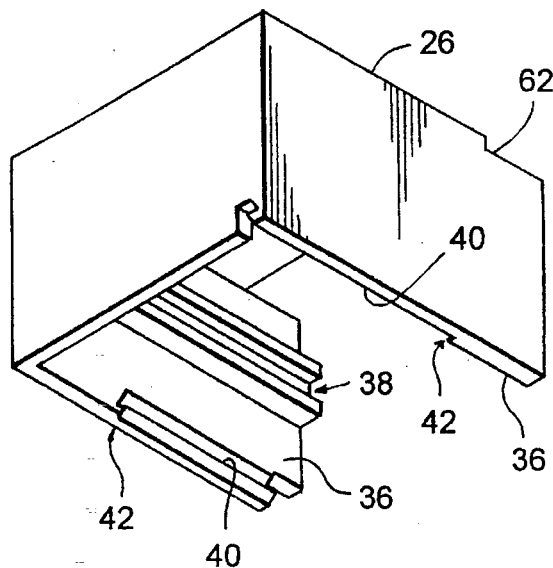
FIG. 3 is an isometric view of a housing of the present invention having a beveled edge configured to receive the base and further having channels configured to receive the daughter board.

Referring now to FIG. 3, an isometric view of housing 26 is shown. Housing 26 includes at least two inside surfaces 36 upon which a pair of channels 38 are formed. Each channel 38 extends at least partially across inside surface 36 beginning at an opening or edge of housing 26. Surfaces 36 further include a beveled edge 40 which extends adjacent an opening into housing 26 between edge stops 42. Beveled edge 40 is adapted to mate with another beveled edge 44 (shown in FIG. 2) formed on the outer surface of base 28. Beveled edge 44 reciprocates outward as beveled edge 44 of base 28 is inserted into housing 26. The beveled mating surfaces of edges 40 and 44 prevent extraction and channel stops 42 prevent lateral movement of base 28 after it is placed.

Referring now to FIG. 4, an exploded isometric view of retainer 30 is shown having a row of slots 46 formed therein. Slots 46 include, for example, beveled edges which extend outward, causing distal portions of retainer conductor 23 to flex outward and snap-fit within slots 46. Similar to base conductors 21, retainer conductors 23 are made of any electrically conductive material such a metal or metal alloy. Each retainer conductor includes a substantially flat upper and lower portions and a groove 54 dimensioned therebetween.

Referring now to FIG. 5, an exploded isometric view of various parts of the interconnect device 10 are shown capable of being connected together between base component 12 and insert component 14. Base 28 is shown assembled with base conductors 21, and the terminating ends of each base conductor 21 is shown placeable over leads 16 between leads 16 and a lower, substantially flat portion of retainer conductors 23. Beveled edge 44 of base 28 is shown placeable into a downward-extending opening within housing 26 and mates with beveled edge 40 (shown in FIG. 3).

Channels 38 (shown in dashed line) face inward toward one another. Channels 38 include an inside dimension which slideably receives corresponding edges of daughter board 22. Daughter board 22 includes a plurality of printed conductors formed according to a normal lithography process. A set of printed conductors terminate at one edge of daughter board 22 as edge connectors 48. Edge connectors 48, according to one embodiment, are coupled via printed conductors to corresponding insert component leads 24.

Channels 38 are adapted to not only receive daughter board 22, but also to receive protrusions 50 of retainer 30. Protrusions 50 include an outer dimension which fits within the inner dimension of channel 38 near the opening into which daughter board 22 and retainer 30 enter. Protrusions 50 of retainer 30 extend within channels 38 causing edge connectors 48 of previously inserted daughter board 22 to frictionally engage within grooves 54 of retainer conductor 23. Retainer 30 is thereby used to retainer daughter board 22 within housing 26 while securing retainer conductors 23 in electrical engagement with edge connectors 48. Housing 26, and the channels and beveled edges formed thereon, is used to hold or "house" the assembled retainer and base in a customized format. Retainer 30 as well as base 28 can be changed or customized to fit any lead arrangement of base component 12 and/or insert component 14. Full customization is achieved merely by changing the configuration (size, slot and channel arrangements) of retainer 30, base 28 and/or housing 26. In the example shown, four leads of DIP base component 12 are connected to four leads of a DIP insert component 14 using appropriately arranged modular parts coupled therebetween. It is understood, however, that components 12 and 14 can have more or less than four leads, and that components 12 and 14 can be any type of integrated circuit package, not limited merely to a DIP package. Further discussion of an interconnect device which couples between components other than DIP components is presented below in reference to FIGS. 8–12.

Figure 6:
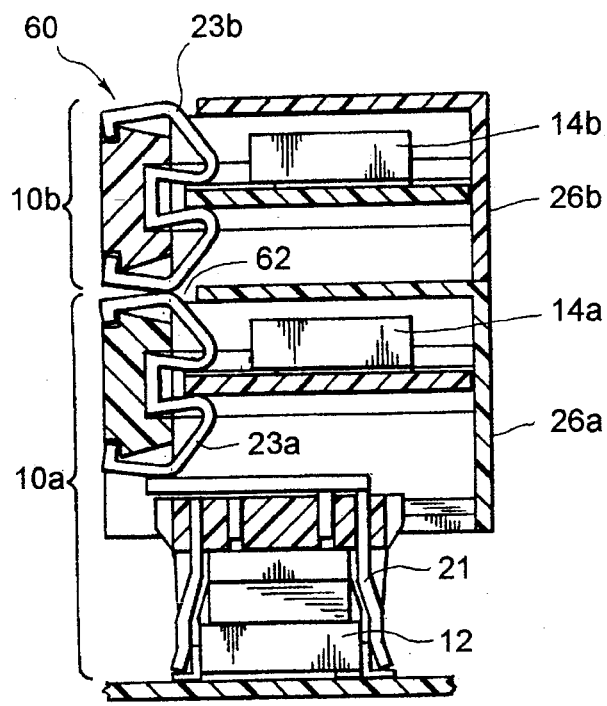
FIG. 6 is a cross-sectional view, partly in elevation, of multiple stacked components electrically connected using multiple interconnect devices according to the present invention.

Referring now to FIG. 6, a stacked interconnect device 60 is shown. Stacked interconnect device 60 includes more than one interconnect device 10 and, in the illustrated example, shows two interconnect devices 10a and 10b. Interconnect device 10a is assembled similar to device 10 shown in FIG. 1. At the upper surface of housing 26a of device 10a is a cut-out 62 (further shown in FIGS. 3 and 5). Cut-out 62 allows test access of a test probe to the upper surface of retainer conductor 23a. Moreover, cut-out 62 allows access of retainer conductor 23a upper surface to retainer conductor 23b lower surface. When housing 26b is coupled upon housing 26a, retainer conductors 23a and 23b correspondingly make connection. A first insert component 14a is thereby connected to a second insert component 14b, and components 14a and 14b are interconnected to base component 12 via base conductor 21 and respective retainer conductors 23a and 23b.

Interconnect device 10b is stacked directly upon interconnect device 10a without requiring a base or base connectors coupled therebetween. The stacking process can be repeated with another interconnect device configured similar to interconnect device 10b placed upon device 10b. The stacked interconnect device 60 thereby includes a mechanism for stacking two or more insert components in spaced relation above a base component.

Figure 7:
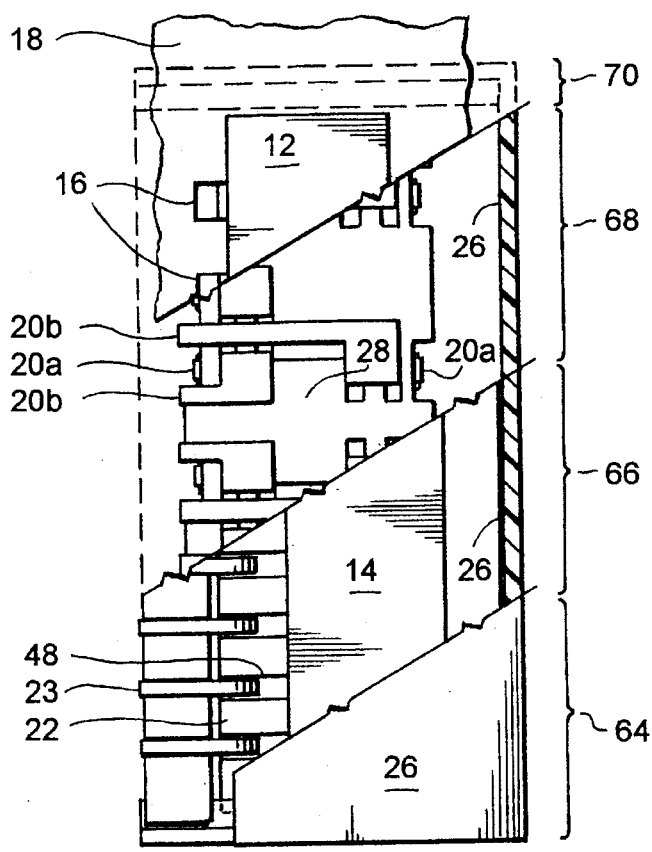
FIG. 7 is a top plan view of the interconnect device having successive planes broken away to illustrate capability of accommodating any number of base component or insert component leads.

Referring now to FIG. 7, a top plan view of an assembled interconnect device 10 is shown having successive planes broken away. Interconnect device 10 is illustrated capable of accommodating any number of base component or insert component leads. Interconnect device 10 is shown in FIG. 7 as having an upper surface or plane 64 indicative of the upper surface of housing 26. Arranged below upper surface 64 is a plane 66 which extends below the upper surface of housing 26 and above insert component 14. Plane 66 illustrates a cross-section of housing 26 as well as the connection between retainer conductors 23 and edge connectors 48 formed at one side of daughter board 22. Another plane 68 is shown at an elevational level below that of plane 66. Plane 68 is at an elevational level below daughter board 22 and above base 28. Plane 68 illustrates lateral-extending portions 20b of base conductor 21 which extend across the upper surface of base 28 from downward-extending portions 20a to one edge of base 28. Another plane 70 is shown at a lower elevational level than plane 68. Plane 70 is taken below base 28 and above mother board 18. The upper surface of mother board 18 is shown having base component 12 mounted thereon. Leads 16 are mounted to printed conductors upon or within mother board 18.

Referring now to FIG. 8, a cross-sectional view of interconnect device 10 is shown according to another embodiment. Interconnect device 10 of FIG. 8 is assembled, according to the embodiment between a leaded chip carrier base component 12 and one or more leaded or leadless chip carrier insert components 14. Base component 12, according to the illustrated example, contains leads extending from four sides in accordance with well-known leaded chip carrier design. Frictionally engaged and electrically coupled with the outer surface of leads 16 are corresponding base conductors 21 having downward-extending portions 20a and lateral-extending portions 20b. Each upper surface portion 20b of base conductor 21 is coupled with a lower surface of respective retainer conductor 23 during times in which retainer 30 and base 28 are engaged within housing 26. Similar to the DIP embodiment, chip carrier embodiment shown in FIG. 8 is a customizeable interconnect device having retainer conductors 23 which connect to edge connectors at the edge of daughter board 22, and wherein retainer conductors 23 and base conductors 21 couple together when placed in housing 26 between the edge connectors and leads 16.

FIG. 9 illustrates an isometric view of the assembled embodiment shown in FIG. 8. In particular, FIG. 9 illustrates interconnect device 10 having four slotted retainers 30 and four slotted bases 28 coupled to a singular frame unit or housing 26. The four retainers 30 and bases 28 connect together as an assembled interconnect device about the periphery of base component 12 (shown in FIG. 8) and insert component 14. Channels 38 upon housing 26 are dimensioned to receive retainer protrusions 50. Housing 26 is also shown having beveled edges 40 dimensioned to receive mating edges 44 of base 28 similar to the attachment mechanism used in the embodiment of FIGS. 1–7.

Figure 10:
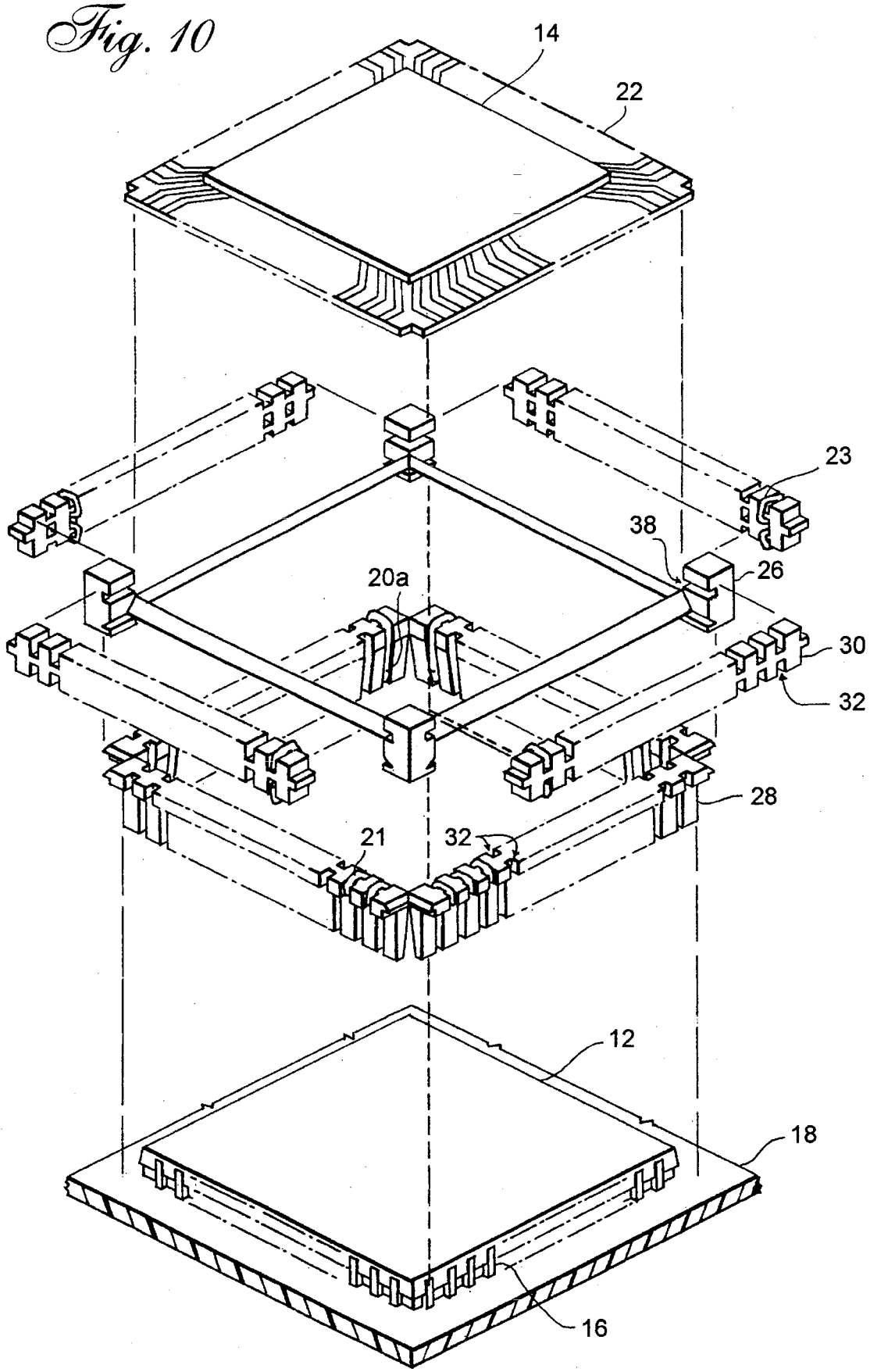
FIG. 10 is an exploded isometric view of the embodiment of FIGS. 8 and 9.

FIG. 10 is an exploded isometric view of the embodiment of FIGS. 8 and 9. Each retainer 30, including retainer slots 32 and retainer conductors 23 are shown placeable within channel 38 of housing 26. The lower surface of retainer conductors 23 couple with the upper surface of base conductors 21 fitted within slots 32 of base 28. Base conductors 21 include downward-extending portions 20a which couple to leads 16 of base component 12. It is appreciated from the drawing of FIG. 10 that base component 12 and insert component 14 can be of any chip carrier design provided in this embodiment there are vertical contact points on base component 12 for receiving base conductors 21. Insert component 14 can have leads or be leadless, and is mounted upon daughter board 22 using well-known connection techniques. It is further appreciated that interconnect device 10 can be assembled together and placed over base component 12 without removing base component 12 from mother board 18.

Figure 11:
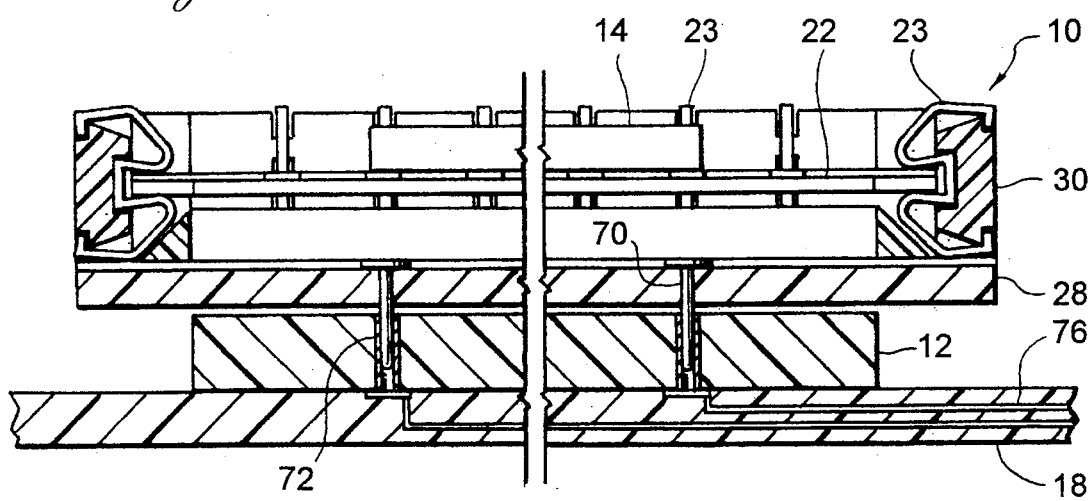
FIG. 11 is a broken cross-sectional view, partly in elevation, of an interconnect device of the present invention assembled according to yet another embodiment between a leadless chip carrier base component arranged upon the mother board and a leaded or leadless insert component arranged upon the daughter board.
Figure 12:
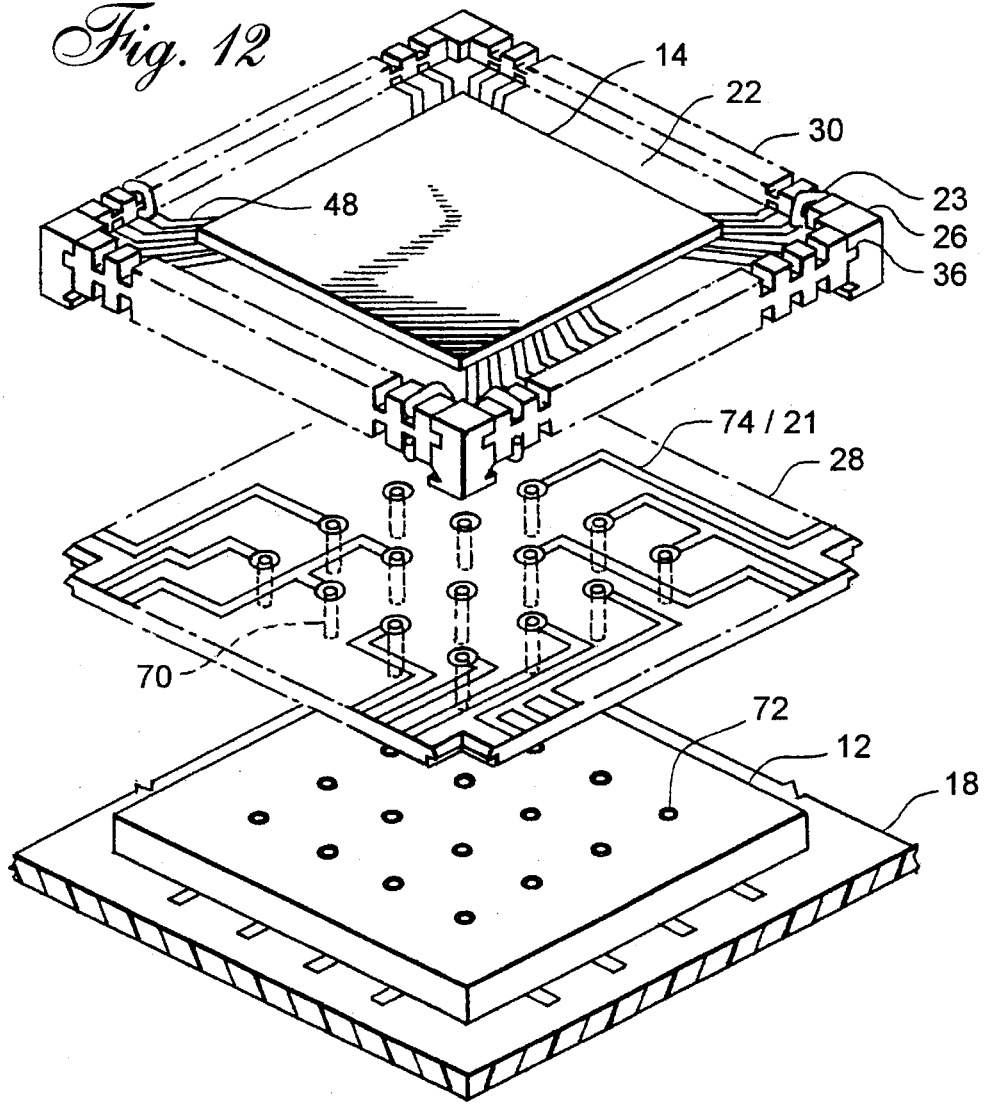
FIG. 12 is an exploded isometric view of the embodiment of FIG. 11.

Referring now to FIGS. 11 and 12, a broken cross-sectional view, partly in elevation, of an interconnect device is shown assembled according to yet another embodiment. Interconnect device 10 includes a base 28, which in the illustrated embodiment, is an adapter board. Base (adapter board) 28 includes a plurality of pins 70 formed at terminating ends of printed conductors 74, wherein printed conductors 74 suffice as base conductors 21 within base 28. Pins 70 extend from a planar surface of base 28 and connect to sockets 72 formed within the upper surface of base component 12. Pins 70 and sockets 72 are designed to frictionally engage with one another using, for example, a zero insertion force (ZIF) arrangement. A ZIF arrangement can include an encapsulated integrated circuit or, alternatively, suffice merely as a pass-through connection of sockets 72 to printed conductors arranged upon or within mother board 18. Mother board 18 includes printed conductors 76 used in the latter case as a routing area between the pass-through component 12 and a packaged integrated circuit coupled elsewhere thereon (not directly below interconnect device 10).

Turning now to FIG. 12, and exploded isometric view of the embodiment of FIG. 11 is shown. In particular, FIG. 12 illustrates connectivity of the various parts used to form interconnect device 10. That is, four retainers 30 are inserted into channels 38 of housing 26. Retainer conductors 23 make physical and electrical contact to edge connectors 48 at each edge of insert card 22. If select connection is not desired, one or more retainer conductor 23 can be omitted from retainer 30. Omission of one or more retainer conductors 23 can more fully customize the interconnect scheme between one or more insert components 14 and/or discrete components upon insert card 22 and base component 12.

Once retainers 30 are coupled within housing 26 and retain daughter board 22, the assembled parts can then be further connected to base conductors 21 formed at the upper surface of base 28. Base conductors 21 are adapted to make connection at the edge of base 28 to the lower surface of retainer conductors 23, and pins 70 pass that conduction to sockets 72 arranged upon component 12.

In each of the above embodiments, regardless of the base and/or insert component/lead configuration, more than one interconnect device can be used. The embodiments of FIGS. 8, 9 and 10 as well as FIGS. 11 and 12 each illustrate an exposed upper surface of retainer conductor 23. The exposed surface or surfaces of retainer conductor 23 can be selectively probed as test locations thereon. Moreover, subsequent retainer 30 and retainer conductors 23 can be stacked upon the exposed surface to allow interconnection of three or more components—i.e., stacking of more than two insert components upon one another above a base component.

It will be appreciated to those skilled in the art having the benefit of this disclosure that this invention is believed to be capable of interconnecting numerous types of packaged integrated circuits. Furthermore, it is also to be understood that the present interconnect device can interconnect printed conductors between a mother board and a daughter board upon which packaged integrated circuits may or may not be placed. Various modifications and changes may be made without departing from the spirit and scope of the invention as set forth in the claims. It is intended that the following claims be interpreted to embrace all such modifications and changes and, accordingly, the specification and drawings are to be regarded in an illustrative rather than a restrictive sense.

What is claimed is:

1. An interconnect device comprising a customizable assembly of parts adapted for coupling between a base component arranged upon a mother board and an insert component arranged upon a daughter board, said interconnect device includes interconnect conductors extending from leads upon said base component to edge connectors arranged upon an edge of said daughter board; wherein said customizable assembly of parts comprises a base and a retainer, each having a customizable outer dimension and plurality of slots arranged therein; and wherein each of said interconnect conductors comprises:

a base conductor fitted within said slots upon said base, said base conductor having one end adapted for frictional engagement with a lead upon said base component and the other end terminating at one side of said base; and a retainer conductor fitted within said retainer, said retainer conductor is contorted such that two substantially flat surfaces are formed with a groove therebetween.

2. The interconnect device as recited in claim 1, wherein said daughter board comprises printed conductors extending from said edge connectors to leads upon said insert component.

3. The interconnect device as recited in claim 1, wherein said base component and insert component are each packaged integrated circuits, and wherein the packaged integrated circuit of said base component includes a lead configuration dissimilar from a lead configuration of the packaged integrated circuit of said insert component.

4. The interconnect device as recited in claim 1, wherein said groove is dimensioned to frictionally engage with one of said edge connectors, and one of said flat surfaces is adapted to electrically contact the end of said base conductor which terminates at one side of said base.

5. The interconnect device as recited in claim 1, further comprising a housing having a channel formed on a surface of said housing, said channel is dimensioned to slideably receive an edge of said daughter board.

6. The interconnect device as recited in claim 1, wherein said retainer includes a protrusion extending therefrom, and said interconnect device comprises a housing having a channel formed on a surface of said housing, said channel is dimensioned to slideably receive said protrusion.

7. An interconnect device comprising a customizable assembly of parts adapted for coupling between a base component arranged upon a mother board and an insert component arranged upon a daughter board, said interconnect device includes interconnect conductors extending from leads upon said base component to edge connectors arranged upon an edge of said daughter board; wherein each of said interconnect conductors comprises:

a base conductor formed upon an adapter card, said base conductor having one end adapted for frictional engagement with a socket upon said base component and the other end terminated at one side of said adapter card; and a retainer conductor fitted within a retainer, said retainer conductor is contorted such that two substantially flat surfaces are formed with a groove therebetween.

8. The interconnect device as recited in claim 7, wherein said groove is dimensioned to frictionally engage with one of said edge connectors, and one of said flat surfaces is adapted to electrically contact the end of said base conductor which terminates at one side of said adapter card.

9. The interconnect device as recited in claim 7, wherein said adapter card is a printed circuit card having two opposed planar surfaces, and wherein said base conductor extends as a printed conductor across said adapter card terminating at one end as a pin extending from one of said planar surfaces.

10. The interconnect device as recited in claim 9, wherein said pin is in registry with and adapted for frictional engagement with said socket.

11. An interconnect device comprising:

a plurality of base conductors dimensioned to fit within slots arranged upon a base, each of said base conductors includes an upper portion and a lower portion arranged orthogonal to said upper portion, wherein said upper portion includes an end which terminates at one side of said base and said lower portion includes an end which terminates as a spring element adapted during use to frictionally engage with a lead extending from a base component;

a plurality of retainer conductors dimensioned to securely fit within a row of spaced slots arranged upon a retainer, each of said retainer conductors includes substantially flat upper and lower portions adjoined by a pair of flexible curved portions and a groove dimensioned therebetween; and a housing adapted to electrically couple said base conductors upon said base to respective said retainer conductors upon said retainer.

12. The interconnect device as recited in claim 11, wherein said lower portion of said base conductors are dimensioned to securely fit within the slots arranged upon said base, and wherein said upper portion extends laterally across an upper surface of said base from said lower portion to one side of said base.

13. The interconnect device as recited in claim 11, wherein said base includes a first beveled edge, and said housing includes a second beveled edge formed in mating registry with said first beveled edge during times in which said base is coupled to said housing.

14. The interconnect device as recited in claim 11, wherein said housing includes a channel formed on a surface of said housing, and said retainer includes a protrusion extending therefrom in sliding engagement with said channel during times in which said retainer is coupled to said housing.

15. The interconnect device as recited in claim 11, wherein the groove of each said retainer conductor is connected to extend from one side of said retainer into said housing a spaced distance above said base during times in which said retainer and base are coupled to said housing.

16. The interconnect device as recited in claim 11, wherein the flexible curved portions are designed to flex apart during times in which an edge of a printed circuit board is inserted into said groove.

17. A stacked interconnect device comprising:

a first customizeable assembly of parts, said first assembly of parts comprises a plurality of base conductors and a first set of retainer conductors connected together to form a conductive path between downward extending elements formed at terminating ends of said base conductors and laterally extending grooves shaped from said first set of retainer conductors; and a second customizeable assembly of parts, said second assembly of parts are engaged in stacked configuration upon said first assembly of parts and said second assembly of parts comprises a second set of retainer conductors extending between upper exposed surfaces of respective said first set of retainer conductors and laterally extending grooves shaped from said second set of retainer conductors.

18. The stacked interconnect device as recited in claim 17, wherein said first and second set of retainer conductors each include an upper surface and a lower surface.

19. The stacked interconnect device as recited in claim 17, wherein the lower surface of said first set of retainer conductors is abutted against and electrically connected to said base conductors, and wherein the upper surface of said first set of retainer conductors is abutted against and electrically connected to the lower surface of said second set of retainer conductors, and further wherein the upper surface of said second set of retainer conductors is adapted to abut against and electrically connect to a lower surface of further sets of retainer conductors.

20. The stacked interconnect device as recited in claim 17, wherein said downward extending elements are dimensioned to frictionally engage with the outer surface of respective leads extending from a base component, and wherein the laterally extending grooves of said first and second set of retainer conductors are dimensioned to receive respective edges of first and second printed circuit boards spaced from each other above said base component.

* * * * *